United States Patent [19]

Holt et al.

[11] Patent Number: 4,893,074
[45] Date of Patent: Jan. 9, 1990

[54] ELECTRONIC DEVICE TESTING SYSTEM

[75] Inventors: Alyn R. Holt, Cherry Hill, N.J.; Brian R. Moore, Postcombe, England

[73] Assignee: inTEST Corporation, Cherry Hill, N.J.

[21] Appl. No.: 193,768

[22] Filed: May 13, 1988

[51] Int. Cl.⁴ ............................ G01R 1/00; G01R 1/04
[52] U.S. Cl. .............................. 324/158 F; 324/158 P; 414/590; 414/673
[58] Field of Search .................. 324/158 F, 158 P, 72, 324/5; 901/14, 17, 48; 414/590, 723, 673, 719; 312/308; 248/68.1, 74.1

[56] References Cited

U.S. PATENT DOCUMENTS

| | | | |
|---|---|---|---|
| 4,229,136 | 10/1980 | Panissidi | 414/673 |
| 4,379,335 | 10/1980 | Kirsch et al. | 901/17 |
| 4,527,942 | 7/1985 | Smith | 324/158 F |
| 4,588,346 | 5/1986 | Smith | 414/673 |
| 4,589,815 | 5/1986 | Smith | 414/590 |
| 4,652,204 | 3/1987 | Arnett | 901/48 |
| 4,705,447 | 11/1987 | Smith | 414/590 |

OTHER PUBLICATIONS inTest Drawing No. 80442, "Installation–Cradle & Docking Assembly FS80ACP," dated 3/4/88.
inTest Drawing No. 80385, "Installation–in-2–TXLT1000," undated.
inTest Drawing No. 80478, "Installation–Cradle & Docking Assembly, AN9035 CPC," date 4/29/87.
inTest Drawing No. 80557, "Installation–in-2–FS15/256/CPS or in2–FS15/128/CPS:" dated 3/23/88.

Primary Examiner—Reinhard J. Eisenzopf
Assistant Examiner—W. Burns
Attorney, Agent, or Firm—Ratner & Prestia

[57] ABSTRACT

An electronic device testing system of the type in which a test head is mounted for pivotal movement about three orthogonal axes. A cable is introduced to the test head along an axis peripendicular to the horizontal axis extending through the means by which the test head is mounted for pivotal movement about the horizontal axis. The system also has a cable support attached at one end to the test head cabinet containing part of the electronics. The cable, extending between the test cabinet and the test head, is supported by the cable support. The cable support is arranged to adjust to changes in the spacing of its end and the orientation of its axis caused by changes in the position or orientation of the test head.

19 Claims, 5 Drawing Sheets

ELECTRONIC DEVICE TESTING SYSTEM

TECHNICAL FIELD

The present invention relates, in general, to the testing of electronic devices and, in particular, to a system in which an electronic test head is positioned to connect to and dock with a handler of the device to be tested.

BACKGROUND ART

In the automatic testing of integrated circuits and other electronic devices, special device handlers have been used which place the device to be tested in position. The electronic testing itself is provided by a large and expensive automatic testing system which includes a test head which connects to and docks with the device handler. The test head uses high speed electronic timing signals so that the electronic circuits must be located as close as possible to the device under test. Accordingly, the test head is densely packaged with electronic circuits in order to achieve the high speed testing of the sophisticated devices.

A manipulator or positioner, movable along a support structure, carries the test head to the desired location at which the test head is positioned to connect to and dock with the device handler. The test head is attached to the positioner by means which permit the test head to be pivoted about two orthogonal axes in addition to the axis of the support structure through which the positioner moves.

A major problem is connecting a heavy cable, extending from a cabinet containing part of the automatic testing system, into the test head which itself is movable to a desired location and into a desired position. Provision must be made for the heavy cable to move with the test head.

One arrangement used in the past has involved passing the cable through the mechanism by which the test head is attached to the positioner. This mechanism is arranged to permit pivotal movement of the test head about a horizontal axis extending through the mechanism and is in line with the cable. The design of this mechanism is particularly complex and expensive when it is adapted for passage of the cable through it to the test head.

In another arrangement, the cable is slung beneath the test head in such a way that it connects into the test head in the side of the test head opposite from the mechanism by which the test head is attached to the positioner. While this approach avoids a complex and expensive mechanism by which the test head is attached to the positioner and the cable is connected to the test head, the cable, hanging beneath the test head to beyond the side of the test head for a number of orientations of the test head, gets in the way of the operator of the testing system. Also, the cable must be lengthened because it extends completely across the bottom of the test head for certain orientations of the test head.

In yet another arrangement, the cable is passed through a cable housing to which the test head is attached for pivotal movement of the test head relative to the cable housing. The cable housing, in turn, is attached to the positioner for pivotal movement of the cable-housing and the test head about a horizontal axis. Although the test head is mounted so that it can be pivoted about two orthogonal axes, the center of gravity of the test head is displaced from the horizontal axis about which the cable housing and test head pivot. As a result, the test head which, as indicated above, is very heavy must be counterbalanced, thereby adding complexity and cost to the means by which the test head is attached to the positioner.

SUMMARY OF THE INVENTION

An electronic device testing system, constructed in accordance with the present invention, includes a support structure and a positioner movable along the support structure. Also included are a cradle and means for attaching the cradle to the positioner for pivotal movement of the cradle about a horizontal axis. A test head is attached to the cradle for pivotal movement of the test head about a second axis pivotable about the horizontal axis in a plane perpendicular to the horizontal axis. The testing system further includes a test cabinet and a cable having a first end extending into the test cabinet and a second end extending into the test head along the second axis.

BRIEF DESCRIPTION OF THE DRAWINGS

FIG. 2 is a perspective view showing the means by which the test head of FIG. 1 is attached to the test head cradle of FIG. 2;

DESCRIPTION OF THE PREFERRED EMBODIMENTS

Figures 1, 2A:
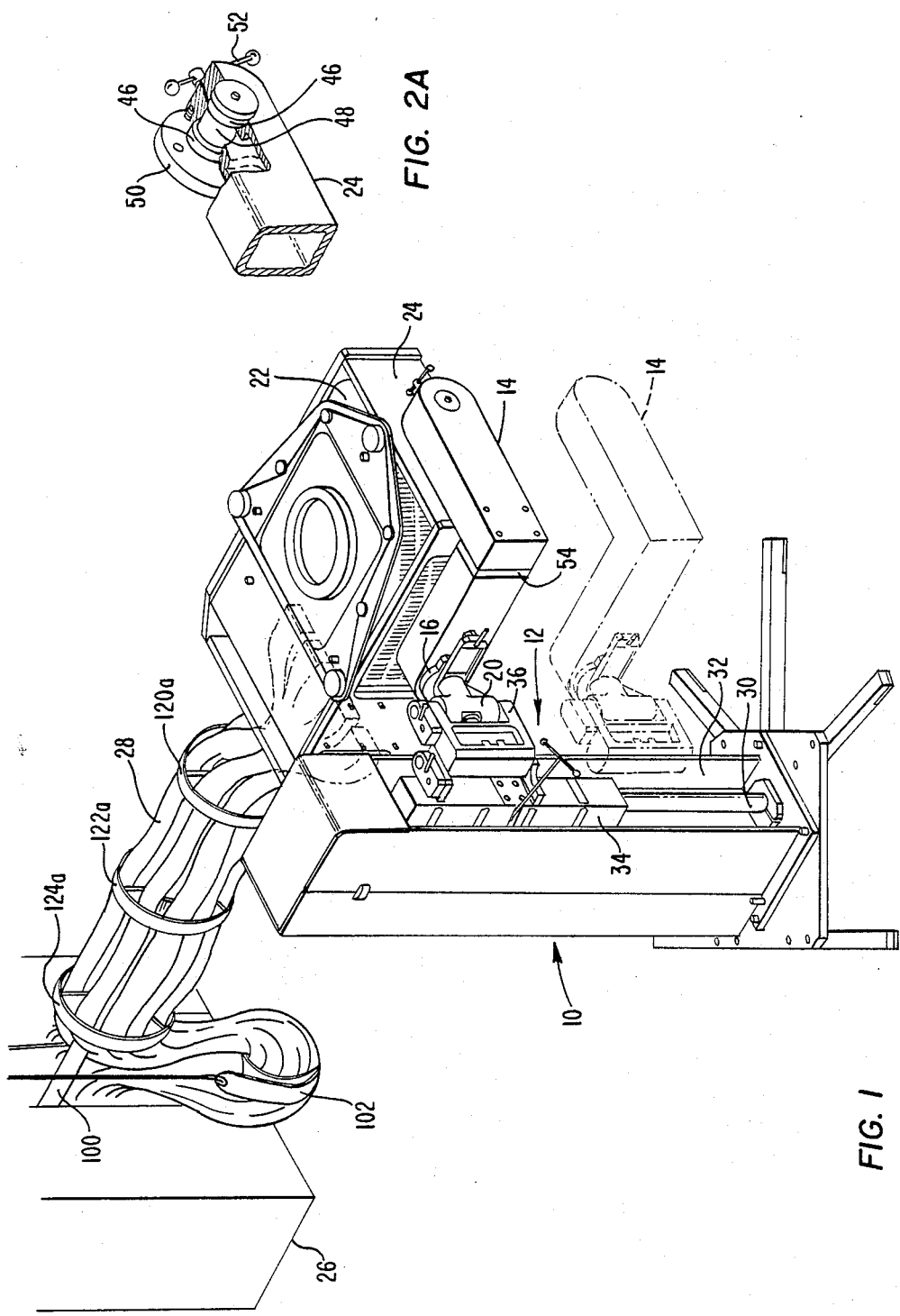
FIG. 1 is a perspective view of a preferred embodiment of an electronic device testing system constructed in accordance with the present invention.
FIG. 2A is a perspective view of a second embodiment of a test head cradle constructed in accordance with the present invention.

FIG. 1 is a perspective view of an electronic device testing system constructed in accordance with the present invention. This system is generally similar to the one described and illustrated in U.S. Pat. Nos. 4,527,942; 4,588,346; and U.S. Pat. No. 4,705,447, the contents of which are incorporated herein by reference. Although a description of the FIG. 1 system is provided herein, more details can be obtained by referring to these three United States patents.

The system of FIG. 1 includes a support structure 10 and a positioner 12 movable vertically along support structure 10. Also included are a cradle 14 and means for attaching the cradle to positioner 12 for pivotal movement of the cradle about a horizontal axis. Such means may include a hub 16 at the end of a shaft (not shown) which rotates within bearings (not shown) in an opening extending through a wrist joint assembly 20. Suitable locking means are provided for fixing cradle 14 in position relative to positioner 12. Additional details about the attachment of cradle 14 to positioner 12 are provided in connection with an explanation of the cradles illustrated in FIGS. 3 and 4.

The FIG. 1 system further includes a test head 22 and means for attaching the test head to cradle 14 for pivotal movement of the test head about a second axis pivotable about the horizontal axis about which the cradle pivots. The pivot axis of test head 22 pivots in a plane perpendicular to the horizontal axis about which cradle 14 pivots. The means for attaching test head 22 to cradle 14 may include a test head yoke 24 which extends around and is secured to the test head and means for attaching the test head yoke to the cradle for pivotal movement of the test head yoke and the test head about the second axis. Added detail about the attachment of test head yoke 24 to cradle 14 is provided in connection with the explanation of the cradles illustrated in FIGS. 2, 3 and 4.

The FIG. 1 system further includes a test cabinet 26 and a cable 28 having a first end extending into the test cabinet and a second end extending into test head 22. As indicated in FIG. 1, cable 28 can be composed of a bundle of individual cables.

Test head 22 is supported and manipulated in its desired vertical position by positioner 12 as the positioner is moved vertically on a main shaft 30 secured to a column 32. The phantom lines in FIG. 1 show cradle 14 and a portion of positioner 12 at a second vertical position. The movement of positioner along support structure 10 can be controlled in a number of ways, such as by counterbalances, powered lead-screw drives, or pneumatic or hydraulic drives.

Positioner 12 includes a main arm assembly 34, a forearm assembly 36 and wrist joint assembly 20. Forearm assembly 36 is attached to main arm assembly 34, so that the forearm assembly can pivot about a vertical axis relative to the main arm assembly. Likewise, wrist joint assembly 20 is attached to forearm assembly 36, so that the wrist joint assembly can pivot about a vertical axis relative to the forearm assembly.

For the embodiment of the invention illustrated in FIG. 1, test head 22 can be moved vertically along support structure 10 and horizontally away from the support structure and pivoted about three orthogonal axes. As indicated above, for a more detailed explanation of the construction and operation of support structure 10 and positioner 12, reference should be made to the aforementioned United States patents.

Figure 2:
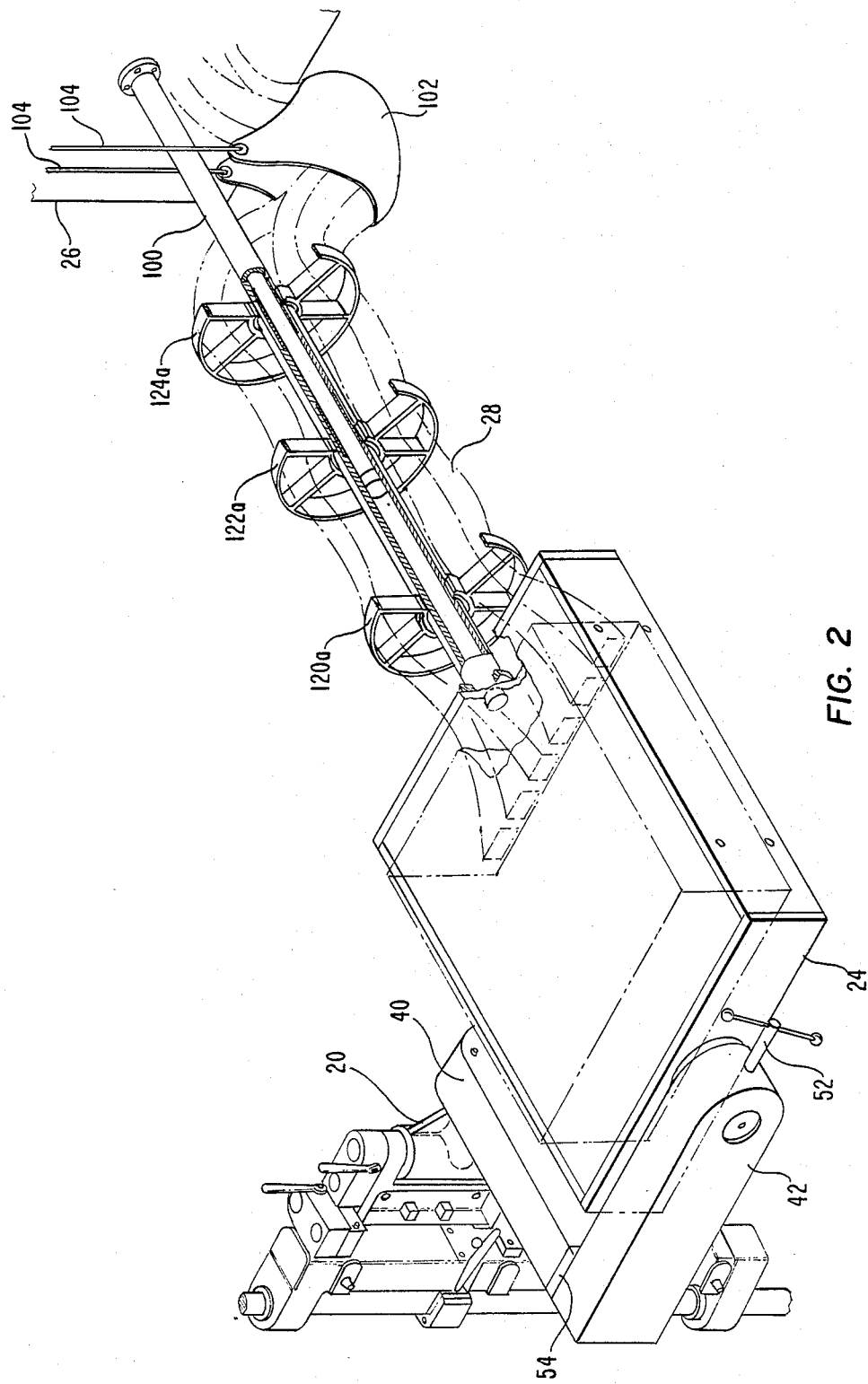
FIG. 2 is a perspective view of a portion of the FIG. 1 system showing, on an enlarged scale, a first test head cradle constructed in accordance with the present invention.
Figure 3:
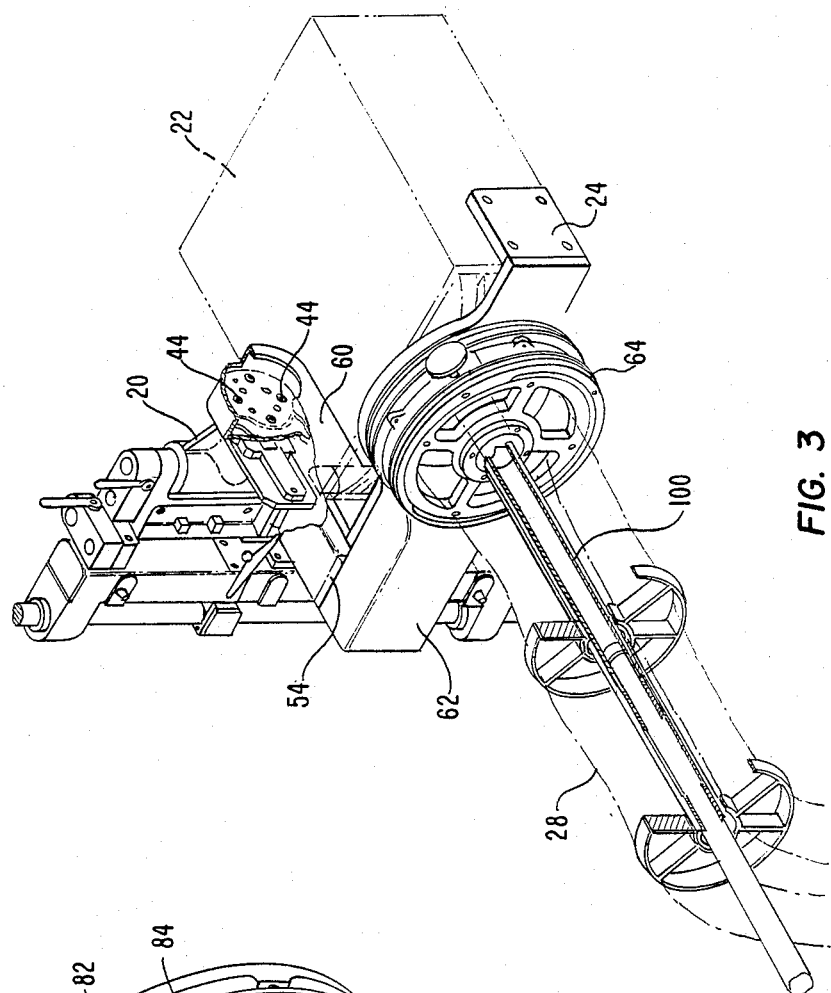
FIG. 3A is a perspective view of the cable pivot housing of the FIG. 3 test head cradle on an enlarged scale.
Figure 4:
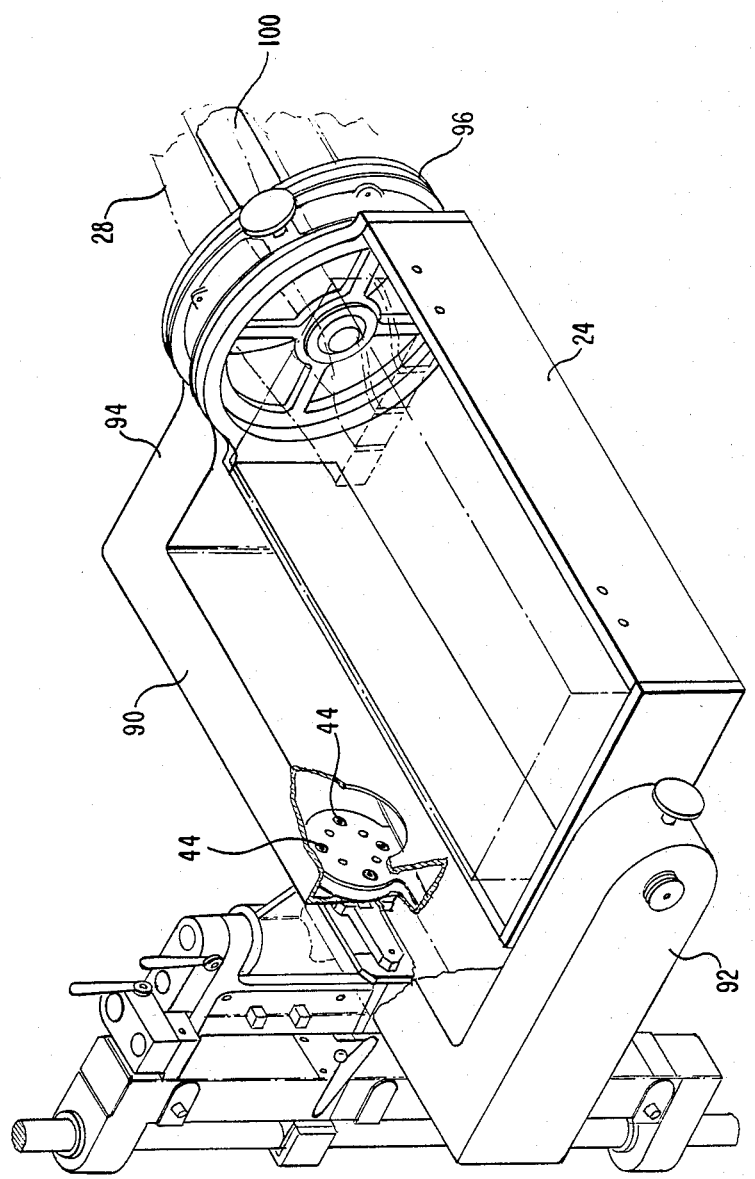
FIG. 4 is a perspective view of a third embodiment of a test head cradle constructed in accordance with the present invention.

Referring to FIG. 2, which shows a first embodiment of a cradle constructed in accordance with the present invention, the cradle includes a first leg 40 which is attached to positioner 12 of the system shown in FIG. 1 and a second leg 42 extending away from leg 40 and to which test head 22 is attached. As indicated in FIGS. 3 and 4, cradle leg 40 can be attached to hub 16 by a plurality of screws 44 which extend through leg 40 into tapped holes in hub 16 which, in turn, is carried by wrist joint assembly 20.

FIG. 2A shows an arrangement which can be used to attach test head 22 to the cradle. Leg 42 of the cradle carries a pair of bearings 46 which receive a shaft 48 welded to a flange 50 which, in turn, is attached to test head yoke 24 by suitable means (not shown). With test head yoke 24 secured to the test head 22, the test head and the test head yoke thereby are attached to leg 42 of the cradle for pivotal movement about the axis along which shaft 48 is oriented. This axis, in turn, is pivotable about the horizontal axis about which leg 40 pivots and is in a plane perpendicular to the axis about which leg 40 pivots. Test head 22 and test head yoke 24 are fixed in place relative to the cradle by means of a locking screw 52.

Positioned between legs 40 and 42 of the cradle is a spacer 54. This spacer, in conjunction with the design of the cradle and the attachment of the cradle to positioner 12, serves to locate the intersection of the two pivot axes at the center of gravity of the assembly attached to the cradle. This assembly includes the test head, the test head yoke, the cable extending into the test head and a cable support 100 which is considered in greater detail hereinafter. Also, it will be noted that cable support 100 is attached to test head yoke 24 below the mid-point of the height of test head 22. This is done to maintain the center of gravity of the assembly where the third axis intersects the other two and is necessitated because the cable extends into the test head near the bottom of the test head.

Cable 28 extends into test head 22 along the axis about which the test head and the test head yoke pivot. For the embodiment of the cradle shown in FIG. 2, cable 28 extends into test head 22 on the opposite side of the test head from leg 42 of the mounting cradle.

Referring to FIG. 3, which shows a second embodiment of a cradle constructed in accordance with the present invention, in this embodiment the cradle also has a first leg 60 attached to positioner 12 in the FIG. 1 system and a second leg 62 to which test head 22 and test head yoke 24 are attached for pivotal movement. As with the FIG. 2 embodiment, the two pivot axes intersect at the center of gravity of the assembly of the test head, the test head yoke, the cable and the cable support. A spacer 54, positioned between legs 60 and 62, is included in FIG. 3 embodiment also for producing this result. In contrast to the FIG. 1 embodiment, cable support 100 is aligned axially with cable 28 at the point where cable 28 is connected to test head 22.

The FIG. 3 embodiment differs from the FIG. 2 embodiment only in the direction of introduction of cable 28 into test head 22 and the mechanism by which the cable is introduced into the test head. In contrast to the FIG. 2 embodiment, in the FIG. 3 embodiment, cable 28 extends through a cable pivot housing 64 and leg 62 of the cradle into test head 22. As with the FIG. 2 embodiment, cable 28 extends into test head 22 along the axis about which the test head and test head yoke 24 pivot.

Figure 3A:
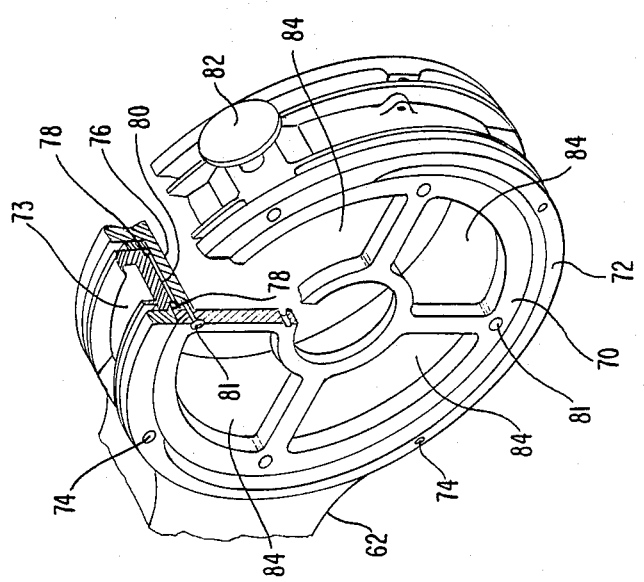

FIG. 3A shows cable pivot housing 64 of FIG. 3 on an enlarged scale. The cable pivot housing includes a webbed member 70 fitted within a stop ring 72 which is fastened to an outer ring 73 by a plurality of screws 74. Outer ring 73 is fabricated as a part of leg 62. Webbed member 70 is arranged to turn within stop ring 72.

The cable pivot housing also includes an inner ring 76 which is connected by suitable means (not shown) to test head yoke 24. Inner ring 76 is spaced from outer ring 73 by a pair of bearings 78 which are held apart by a spacer ring 80. Webbed member 70 is attached to inner ring 76 by a plurality of screws 81. A locking screw 82 locks inner ring 76 in place, relative to outer ring 73, when test head 22 and test head yoke 24 have been moved into the desired position. This is accomplished by the point end of locking screw 82 bearing against outer ring 73 which, in turn, comes into contact with spacer ring 80 to prevent rotation of inner ring 76 relative to the outer ring.

Cable 28 extends through four openings 84 in webbed member 70 to test head 22. Test head yoke 24 has an outer shape corresponding to the cable pivot housing and has an opening through which cable 28 can pass into test head 22. With webbed member 70 rotatable within stop ring 102, the webbed member and the cable turn with inner ring 76 as test head 22 and test head yoke 24 are moved to the desired position. It will be apparent that webbed member 70 can be arranged differently from that which is shown in FIGS. 3 and 3A, namely a different number of openings can be provided through which the cable passes to the test head.

Referring to FIG. 4, which shows a third embodiment of a cradle constructed in accordance with the present invention, this cradle includes a first leg 90 which is attached to positioner 12 in the same manner as legs 40 and 60 in the FIGS. 2 and 3 embodiments, respectively. The cradle of FIG. 4 also includes a second leg 92 to which test head 22 and test head yoke 24 are attached for pivotal movement of the test head and the test head yoke in a manner similar to the FIG. 2 embodiment. Again, the cradle and its attachment to the positioner are arranged, so that the two pivot axes intersect at the center of gravity of the assembly of the test head, the test head yoke, the cable and the cable support. However, in the FIG. 4 embodiment of the invention, alignment of the center of gravity of this assembly on the horizontal axis about which cradle leg 90 pivots is accomplished by moving the location of the attachment of the cradle to hub 16 to the appropriate point on leg 90. As with the FIG. 3 embodiment, cable support 100 is aligned axially with cable 28 at the point where cable 28 is connected to test head 22.

The FIG. 4 mounting cradle also includes a third leg 94 which extends away from leg 90 parallel to leg 92. A cable pivot housing 96, generally similar to the cable pivot housing of the FIG. 3 embodiment, is arranged on leg 94. The FIG. 4 embodiment of the cradle differs from the FIGS. 2 and 3 embodiments in that test head yoke 24 is attached at both its ends to the cradle for pivotal movement of test head 22 and the test head yoke. Again, cable 28 extends into test head 22 along the axis about which the test head and test head yoke 24 pivot.

Referring again to FIG. 1, another aspect of the present invention is the provision of a cable support 100 along which cable 28 extends. For the embodiment of the invention illustrated in FIG. 1, one end of cable support 100 is attached to test head yoke 24. The other end of cable support 100 is attached to another support structure, such as test cabinet 26 or a separate unit (not shown) positioned near the point at which cable 28 exits the test cabinet. As will be explained in connection with FIG. 5, cable support 100 is a telescoping unit which expands or contracts as the spacing between its ends changes due to changes in the position or orientation of test head 22 relative to the location of test cabinet 26. Accordingly, the ends of cable support 100 are connected to their respective parts by spherical bearings which accommodate changes in the orientation of the axis of the cable support. FIG. 2 shows, on an enlarged scale, cable support 100 extending between test head yoke 24 and test cabinet 26. FIGS. 3 and 4 show the attachment of cable support 100 to cable pivot housings 64 and 96, respectively.

As shown in FIGS. 1 and 2, a length of cable 28 rests within a cable sling 102 which is attached by one or more wires 104 to a counter-balance unit (not shown), such as a constant force spring or counterweights. As the spacing between the ends of cable support 100 changes, so that the spacing between the ends of cable 28 also changes, cable sling 102 moves vertically to either "play-in" or "play-out" the cable as required.

Figure 5:
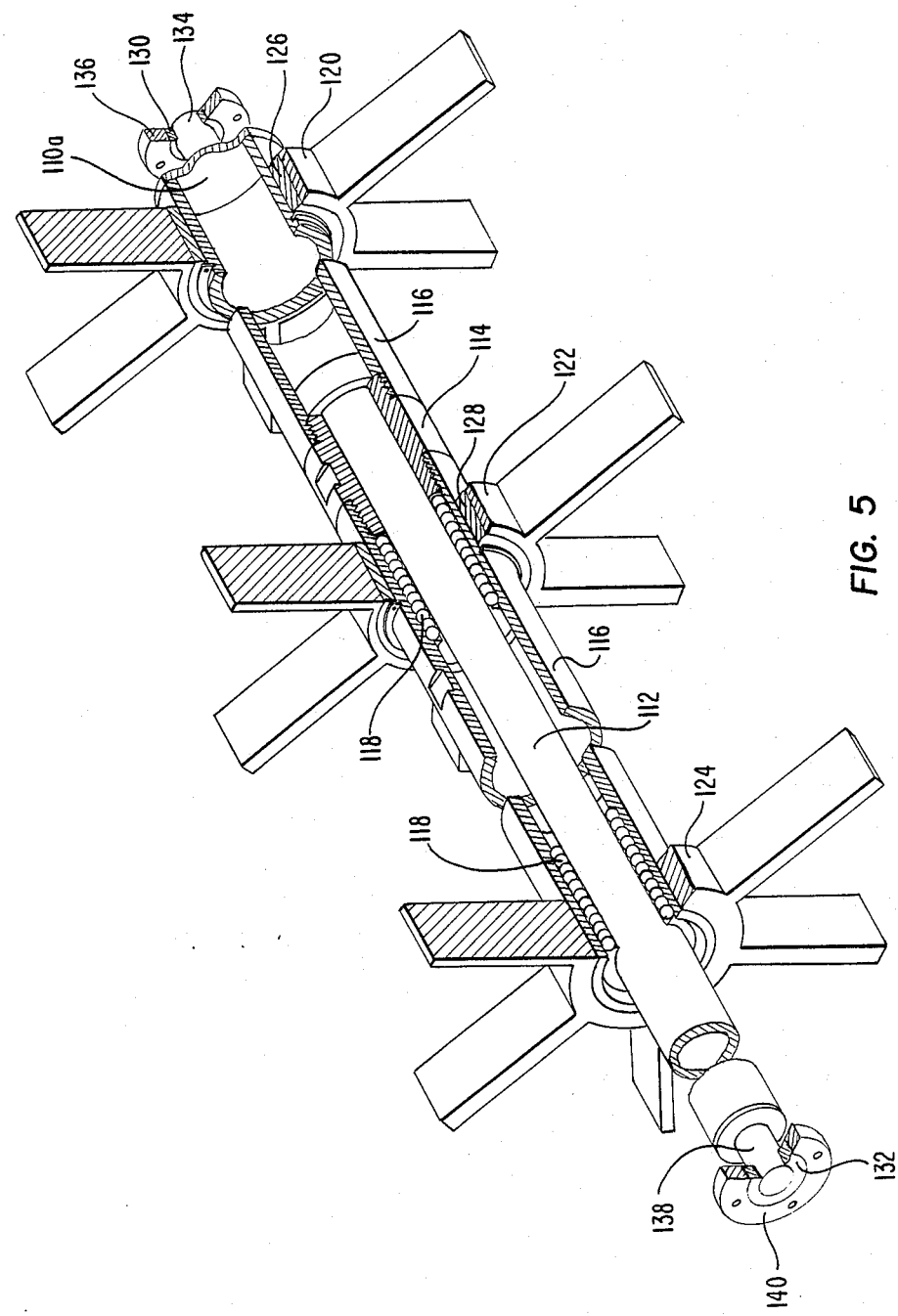
FIG. 5 is a perspective view showing the cable support of the FIG. 1 system on an enlarged scale.

Referring to FIG. 5, the cable support includes a cylinder 110 within which a piston 112 can move. Movement of piston 112 is limited in one direction by the closed end 110a of cylinder 110 and in the other direction by a cylindrical piston stop 114. Cylinder 110 is attached to piston stop 114 by a threaded connection.

On the opposite side of piston stop 114 from cylinder 110 is a cylindrical bearing collar 116 which also is attached to the piston stop by a threaded connection. Bearing collar 116 captures a pair of linear bearings 118 positioned between piston 112 and bearing collar 116. Linear bearings 118 permit relative linear movement between piston 112 and the assembly of cylinder 110, piston stop 114, and bearing collar 116.

The cable support further includes three cable support webs 120, 122 and 124. Cable support web 120 is fitted on and turns relative to cylinder 110 by means of a needle bearing 126. Cable support web 122 is fitted on and turns relative to bearing collar 116 by means of a needle bearing 128. Cable support web 124 is fitted on bearing collar 116 by a press fit, so that this cable support web does not turn relative to the bearing collar. When the cable support is used in conjunction with the cable pivot housings of FIGS. 3 and 4, cable support web 120 of the cable support is webbed member 70 of the cable pivot housing.

The vanes of cable support webs 120, 122 and 124 are arranged, so that individual cables within the bundle pass between pairs of vanes. The individual cables are retained between the vanes of the cable support webs by bands or straps 120a, 122a and 124a as shown in FIGS. 1, 2 and 3.

As already indicated, each end of the cable support is attached to its respective part by means of a spherical bearing. These spherical bearings are identified in FIG. 5 by reference numerals 130 and 132. The spherical bearings allow for rotation and gimbaling of the ends of the cable support relative to the parts to which the cable support is attached. The closed end 110a of cylinder 110 has a extension 134 which is received by spherical bearing 130. This spherical bearing is fitted within a mounting flange 136 which, in turn, is attached to test head yoke 24 in the FIG. 2 embodiment of the invention or to webbed member 70 of the cable pivot housings 64 and 96 in the FIGS. 3 and 4 embodiments of the invention.

At the opposite end of the cable support, piston 112 has an extension 138 which is received by spherical bearing 132. This spherical bearing is fitted within a mounting flange 140 which, in turn, is attached to test cabinet 26.

As the position or orientation of test head 22 changes, piston 112 moves linearaly within the assembly of cylinder 110, piston stop 114 and bearing collar 116. Changes in the orientation of the axis of the cable support are accommodated by spherical bearings 130 and 132. In addition, the cable connected to the test head, can twist along the length of the cable support as the test head pivots relative to the assembly of cylinder 110, piston stop 114 and bearing collar 116, because cable support webs 120 and 22 turn relative to cylinder 110 and bearing collar 116, respectively.

As is evident from a comparison of FIGS. 2 and 3, test head yoke 24 may take different forms. In FIG. 2, the test head yoke extends completely around the lateral sides of the test head, while in FIG. 3, the test head yoke extends only along the sides of the test head extending along the cradle legs and a portion of the side of the test head opposite from the positioner. The particular test head yoke to be used is dependent upon the selected cradle and the test head and, for certain test heads, the test head yoke can be eliminated entirely, so that the test head is attached directly to the cradle and the cable support is attached directly to the test head.

While in the foregoing there have been described preferred embodiments of the present invention, it should be understood to those skilled in the art that various modifications and changes can be made without departing from the true spirit and scope of the invention as recited in the claims.

What is claimed is:

1. An electronic device testing system comprising:
   a support structure;
   a positioner movable along said support structure;
   a test head assembly including:
   (a) a cradle,
   (b) means for attaching said cradle to said positioner for pivotal movement of said cradle about a horizontal axis,
   (c) a test head, and
   (d) means for attaching said test head to said cradle for pivotal movement of said test head about a second axis pivotable about said horizontal axis in a plane perpendicular to said horizontal axis;
   a test cabinet;
   a cable support;
   means for attaching a first end of said cable support to said test head assembly;
   and a cable connected between said test head and said test cabinet and extending along said cable support away from said test head assembly.

2. An electronic device testing system according to claim 1 wherein said cable is connected into a side of said test head which is disposed perpendicular to said second axis.

3. An electronic device testing system according to claim 1 wherein said cradle includes:
   (a) a first leg attached to said positioner by said cradle attaching means, and
   (b) a second leg extending away from said first leg and to which said test head is attached by said test head attaching means.

4. An electronic device testing system according to claim 3 wherein said cable extends into said test head on the opposite side of said test head from said second leg of said cradle.

5. An electronic device testing system according to claim 3 wherein said cable extends through said second leg of said cradle into said test head.

6. An electronic device testing system according to claim 4 wherein said cradle includes a third leg extending away from said first leg parallel to said second leg and said cable extends through said third leg into said test head.

7. An electronic device testing system according to claim 3 wherein said test head attaching means include:
   (a) a test head yoke secured to said test head, and
   (b) means for attaching said test head yoke to said second leg of said cradle for pivotal movement of said test head yoke and said test head about said second axis.

8. An electronic device testing system according to claim 7 wherein said cable extends into said test head on the opposite side of said test head from said second leg of said cradle.

9. An electronic device testing system according to claim 8 wherein said cable extends through said second leg of said cradle and said test head yoke into said test head.

10. An electronic device testing system according to claim 8 wherein said cradle includes a third leg extending away from said first leg parallel to said second leg and said cable extends through said third leg and said test head yoke into said test head.

11. An electronic device testing system according to claim 8 wherein said cable support is attached to said test head yoke.

12. An electronic device testing system according to claim 11 further including means for attaching a second end of said cable support to a second support structure.

13. An electronic device testing system according to claim 12 wherein said cable support includes a telescoping unit having said first end attached to said test head yoke and said second end attached to said second support structure.

14. An electronic device testing system according to claim 13 wherein said cable support further includes means mounted on said telescoping unit for twisting said cable about said telescoping unit as said test head pivots about said second axis.

15. An electronic device testing system according to claim 3 further including means for attaching a second end of said cable support to a second support structure.

16. An electronic device testing system according to claim 15 wherein said cable support includes a telescoping unit having said first end attached to said test head assembly and said second end attached to said second support structure.

17. An electronic device testing system according to claim 16 wherein said cable support further includes means mounted on said telescoping unit for twisting said cable about said telescoping unit as said test head pivots about said second axis.

18. An electronic device testing system according to claim 12 wherein said means for attaching said first end of said cable support to said test head assembly and said means for attaching said second end of said cable support to said second support structure each include a spherical bearing which permits rotation and gimbaling between said cable support and said test head assembly and between said cable support and said second support structure.

19. An electronic device testing system according to claim 15 wherein said means for attaching said first end of said cable support to said test head assembly and said means for attaching said second end of said cable support to said second support structure each include a spherical bearing which permits rotation and gimbaling between said cable support and said test head assembly and between said cable support and said second support structure.

* * * * *